United States Patent [19]

Dorney et al.

[11] Patent Number: 6,088,274

[45] Date of Patent: Jul. 11, 2000

[54] METHOD AND DEVICE FOR TESTING A SEMICONDUCTOR SERIAL ACCESS MEMORY DEVICE THROUGH A MAIN MEMORY

[75] Inventors: Timothy D. Dorney; Steven C. Eplett, both of Houston; Rishad S. Omer, Sugar Land; John E. Riley, Katy, all of Tex.

[73] Assignee: Texas Instruments Incorporated, Dallas, Tex.

[21] Appl. No.: 09/252,169

[22] Filed: Feb. 18, 1999

Related U.S. Application Data

[60] Provisional application No. 60/075,040, Feb. 18, 1998.

[51] Int. Cl.[7] .................................................. G11C 7/00
[52] U.S. Cl. .......................................... 365/201; 365/200
[58] Field of Search ..................................... 365/201, 200

[56] References Cited

U.S. PATENT DOCUMENTS

| | | | |
|---|---|---|---|
| 4,654,849 | 3/1987 | White, Jr. et al. | 371/21 |
| 4,661,930 | 4/1987 | Tran | 365/201 |
| 5,422,892 | 6/1995 | Hii et al. | 371/24 |
| 5,457,696 | 10/1995 | Mori | 365/201 |

*Primary Examiner*—David Nelms
*Assistant Examiner*—M. Tran
*Attorney, Agent, or Firm*—Robby T. Holland; Carlton H. Hoel; Frederick J. Telecky, Jr.

[57] ABSTRACT

A method and apparatus for testing a semiconductor serial access memory (30) device through a main memory (20) includes a semiconductor memory comprising a main memory (20) and a serial access memory (30). A test data (48) is generated and an expected test data (50) that is equivalent to the test data (48) is also generated. The test data (48) is stored in the main memory and sent to the serial access memory (30). The test data (48) in the serial access memory is then sent back to the main memory (20) and stored in the main memory (20). The test data (48) is then read from the main memory (20). Then, the test data (48) read from the main memory is compared with the expected test data (50), producing an output having a first state if the test data (48) read from the main memory (20) is similar to the expected test data (50) or a second state if the test data (48) read from the main memory (20) is different than the expected test data (50).

9 Claims, 3 Drawing Sheets

METHOD AND DEVICE FOR TESTING A SEMICONDUCTOR SERIAL ACCESS MEMORY DEVICE THROUGH A MAIN MEMORY

This Application claims benefit of provisional Application No. 60/075,040 Feb. 18, 1998.

TECHNICAL FIELD OF THE INVENTION

This invention relates generally to the testing of integrated circuit devices and more specifically to a method and apparatus for testing a semiconductor serial access memory device through a main memory.

BACKGROUND OF THE INVENTION

Integrated circuit and semiconductor memory devices store information in arrays of cells arranged in addressable rows and columns. During fabrication of these devices, one or more defects may occur and hinder the proper performance of the memory circuit. Some types of defects may be analyzed and corrected on the device. Other types of defects may not be corrected and are the cause of failed devices. Distribution of defects in any memory device may be random. The yield of good devices per wafer can be improved over time by eliminating the causes of such defects.

As generations of new memory devices are designed and built, integrated circuit memories have increasing bit densities, smaller storage cell sizes, and more input/output (I/O) pins. As a result, devices are more susceptible to defects caused by processing variations and reduced tolerances. Testing has to be done to detect and correct the defects so that sufficiently high device yields are achieved for profitable production.

Additionally, it is desirable for semiconductor memories to have faster data I/O. One method of facilitating high speed data I/O within a semiconductor is to provide a subarray. The subarray is advantageous to use because data can be read from it at a faster speed than data from the main memory in the semiconductor memory.

One type of subarray is a serial access memory (SAM), which is used in video random access memory (VRAM) devices. The main memory and the SAM operate asynchronously. The main array and the SAM each have its own set of I/O pins. The main array and the SAM are functionally connected just during the transfer of data from the main array to the SAM or vice versa.

As with other integrated circuit memory devices, there exists the probability that a defect might occur during the manufacturing of the SAM. A defect can cause erroneous data to either be read or written from the SAM. Redundant cells exist in the SAM to replace defective addresses, similar to what is done in the main array. The problem, however, is being able to efficiently and quickly test for defects in the SAM.

Tests exist to test main memory devices. During testing to determine if there are any bit failures in the main memory, a limited number of I/O pins are connected to a device tester. Connecting fewer I/O pins to the device tester allows more devices to be tested in parallel. The standard approach has been to just connect I/O pins of the main memory to the device tester and test the main memory using on-chip comparison logic. However, there is a problem in using the I/O pins of the main memory and the on-chip comparison logic to test the SAM.

SUMMARY OF THE INVENTION

From the foregoing, it may be appreciated that a need has arisen for a method and apparatus for testing a semiconductor serial access memory device through a main memory using the on-chip comparison logic and the same I/O pins used for testing the main memory while minimizing the amount of silicon area used.

In accordance with one embodiment of the present invention, a method for testing a serial access memory comprises the steps of: providing a main memory; generating a test data and an expected test data that is equivalent to the test data; storing said test data in said main memory; sending said test data from said main memory to said serial access memory; storing the test data in the serial access memory; reading the test data from the serial access memory; comparing the test data read from the serial access memory with the expected test data; and producing an output having a first state if the test data read from the serial access memory is at a voltage level corresponding to a same logic level as the expected test data or a second state if the test data read from the serial access memory is at a voltage level corresponding to a different logic level as the expected test data.

In accordance with another embodiment of the present invention, a method for testing a serial access memory comprises the steps of: providing a semiconductor memory, the semiconductor memory comprising a main memory and the serial access memory; generating a test data, wherein an expected test data is equivalent to the test data; storing the test data in the main memory; sending the test data from the main memory to the serial access memory; storing the test data in the serial access memory; sending the test data from the serial access memory to at least one multiplexer; sending the test data from the multiplexer to at least one amplifier; storing the test data in the at least one amplifier; comparing the test data from the amplifier with the expected test data; and producing an output having a first state if the test data from the amplifier is similar to the expected test data or a second state if the test data from the amplifier is different than the expected test data.

In accordance with another embodiment of the present invention, a test system of a semiconductor serial access memory comprises: a semiconductor memory comprising a main memory and the serial access memory; a test data, wherein the test data can be stored in the main memory and transferred to and stored in the serial access memory; an expected test data, wherein the expected test data is equivalent to the test data; and a comparator, wherein the comparator is connected to the serial access memory and is used to compare the test data from the serial access memory with the expected test data, wherein the comparator outputs a first state if the test data from the serial access memory is similar to the expected test data or a second state if the test data from the serial access memory is different than the expected test data.

In accordance with another embodiment of the present invention, a method for testing a serial access memory through a main memory comprises the steps of: providing a semiconductor memory, the semiconductor memory comprising the main memory and the serial access memory; generating a test data, wherein an expected test data is equivalent to the test data; storing the test data in the serial access memory; sending the test data from the serial access memory to the main memory; storing the test data in the main memory; reading the test data from the main memory; comparing the test data read from the main memory with the expected test data; and producing an output having a first state if the test data read from the main memory is similar to the expected test data or a second state if the test data read from the main memory is different than the expected test data.

In accordance with another embodiment of the present invention, a method for testing a serial access memory through a main memory comprises the steps of: providing a semiconductor memory comprising the serial access memory and the main memory; generating a test data, wherein an expected test data is equivalent to the test data; storing the test data in the main memory; sending the test data from the main memory to the serial access memory; storing the test data in the serial access memory; reading the test data from the serial access memory; reading the test data from the main memory; comparing the test data read from the serial access memory with the test data read from the main memory and the expected data; and producing an output having a first state if the test data read from the serial access memory is similar to the test data read from the main memory and is similar to the expected data or a second state if the test data read from the serial access memory is different than the test data read from the main memory or is different than the expected data.

In accordance with another embodiment of the present invention, a test system for testing a serial access memory through a main memory comprises: a semiconductor memory comprising a main memory and the serial access memory, wherein the serial access memory has a plurality of data input/output pins, wherein none of the plurality of data input/output pins of the serial access memory are connected to a device tester; a test data, wherein the test data can be transferred to and stored in the main memory, then the test data from the main memory can be transferred to and stored in the serial access memory, and then the test data from the serial access memory can be transferred to and stored in the main memory; an expected test data, wherein the expected test data is equivalent to the test data; and a comparator, wherein the comparator is connected to the main memory and is used to compare the test data from the main memory with the expected test data, wherein the comparator outputs a first state if the test data from the main memory is similar to the expected test data or a second state if the test data from the main memory is different than the expected test data.

A technical advantage of the present invention is that a method and apparatus for testing a semiconductor serial access memory is disclosed. Another technical advantage of the present invention is that a method and apparatus for testing a semiconductor serial access memory through a main memory is disclosed.

The present invention allows use of the existing on-chip comparison logic and the same I/O pins of the main memory that are connected to a device tester. Because the SAM data I/O pins do not have to be connected to the device tester, testing is faster because more devices can be connected to the tester. Additionally, the test system can test any subarray memory including a SAM or a subarray used in VRAM memory.

Another technical advantage is that the invention provides a means to improve laser repair yield in a SAM, especially in a VRAM. By being able to test the main memory and the SAM, laser repair information can be prepared on the SAM to improve yield. Previously, the was not tested in laser repair.

Another technical advantage is that this method is capable of testing the main memory through a SAM, irrespective of whether the SAM is used in standard operation.

The present invention also reduces the test time to test the SAM during the manufacturing process. The SAM can be tested at the same time as the main memory, thus a separate test for the SAM is not necessary. Additionally, the SAM can be tested while, after, or before the main memory is tested. Moreover, the test system uses a minimal amount of silicon area, as it takes advantage of already existing circuitry.

Other technical advantages of the present invention are set forth in part in the description which follows, and in part, will be apparent from this description, or may be learned from the practice of the invention.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
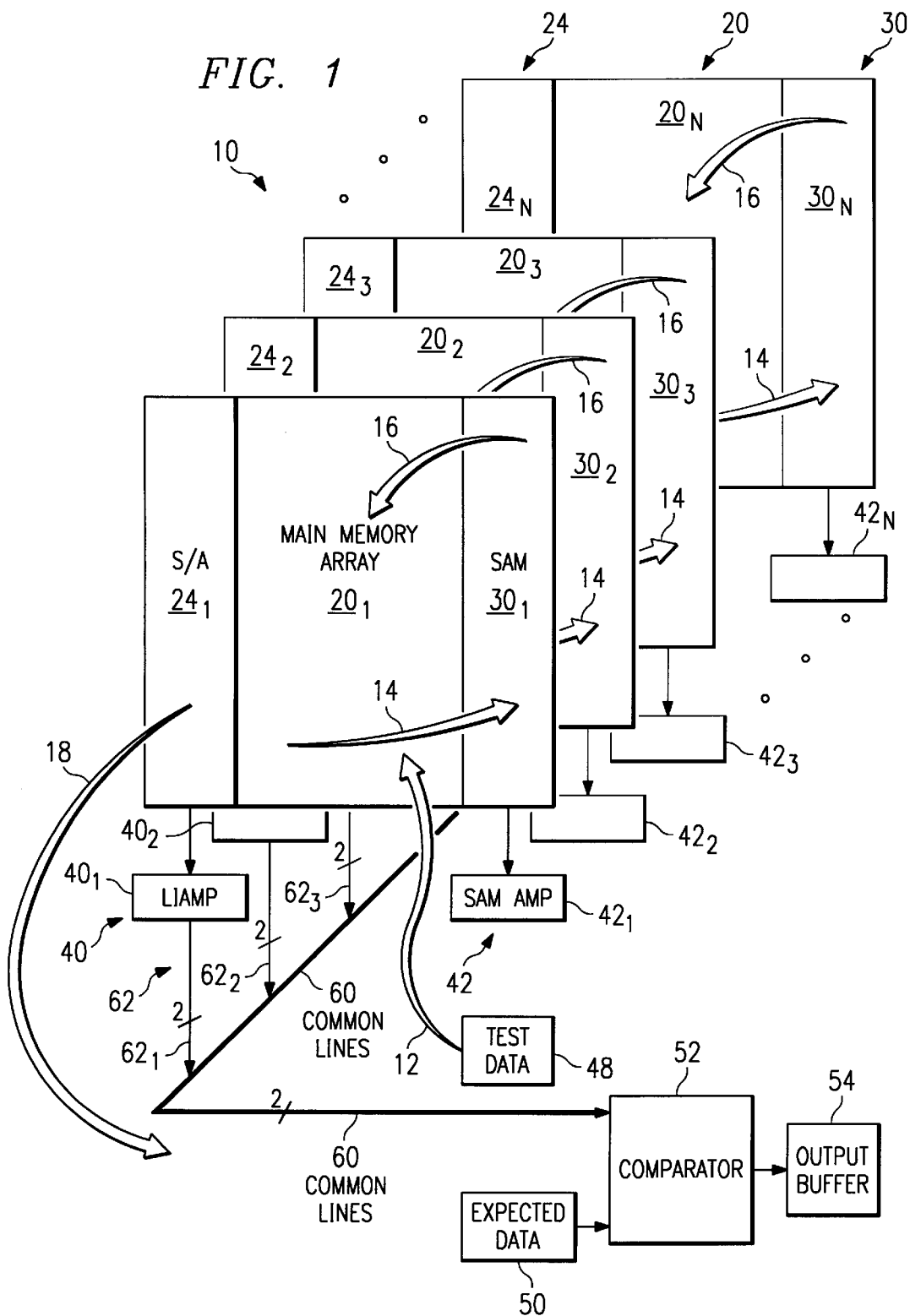
FIG. 1 illustrates a block diagram of a test system of a semiconductor serial access memory according to a first embodiment of the present invention.

The embodiments of the present invention and its advantages are best understood by referring to FIGS. 1 though 3 of the drawings, like numerals refer to like and corresponding parts of the various drawings.

FIG. 1 illustrates a block diagram of a test system of a semiconductor SAM according to a first embodiment of the present invention. A test system 10 includes a semiconductor memory, for example a VRAM. The semiconductor memory of test system 10 includes a main memory 20. Main memory 20 is an integrated circuit. Main memory consists of N different main memory arrays $20_1, 20_2, 20_3, \ldots, 20_N$. Main memory arrays $20_1, 20_2, 20_3$, and $20_N$ are shown. The others are represented by the ellipses located between main memory arrays $20_3$ and $20_N$. All of main memory arrays $20_1$ to $20_N$ are arranged to be accessible for reading or writing data into one of the addressed storage cells of each of the main memory arrays $20_1$ to $20_N$. Moreover, main memory 20 includes multiple rows. For explanatory purposes, N is considered to be 16, although it is to be understood that N can be any positive integer.

Test system 10 also includes a SAM 30. SAM 30 can be a subarray, register, or any other subarray device, however, for purposes of this disclosure, the SAM will be used. SAM 30 is an integrated circuit. SAM 30 consists of N different SAM arrays $30_1, 30_2, 30_3, \ldots, 30_N$ that can be functionally connected to main memory $20_1, 20_2, 20_3, \ldots, 20_N$. SAM arrays $30_1, 30_2, 30_3$, and $30_N$ are shown. The others are represented by the ellipses located between SAM arrays $30_3$ and $30_N$. All of SAM arrays $30_1$ to $30_N$ are arranged to be accessible for writing data into one of the addressed storage cells of each array.

Main memory 20 includes a plurality of I/O pins (not shown). This plurality of I/O pins are used to connect the semiconductor memory to a device tester (not shown). The same plurality of I/I/O pins connected to the device tester to test main memory 20 using conventional methods are used to test SAM 30. Additionally, while SAM 30 can also have a plurality of I/O pins (not shown), the data I/O pins of SAM 30 need not be connected to the device tester.

SAM 30 can read data from main memory 20 by having data transferred from main memory 20 to SAM 30. Additionally, SAM 30 can be designed to be able to write data to main memory 20. SAM 30 writes data by having data transferred from SAM 30 to main memory 20.

Main memory 20 is controlled by external clocks, row address strobe (RAS_) (not shown) to select a row and a column address strobe (CAS_) (not shown) to select a column. SAM 30 is controlled by a serial clock (not shown). Alternatively, main memory 20 and SAM 30 may be controlled by additional clocks.

Each of main memory arrays $20_1$ to $20_N$ of main memory 20 are connected to a sense amplifier (S/A) 24 and a local I/O amplifier (LIAMP) 40. The multiple S/As 24 are comprised of S/As $24_1$, $24_2$, $24_3$, . . . $24_N$ and the multiple LIAMPs 40 are comprised of LIAMPs $40_1$, $40_2$, $40_3$, . . . , $40_N$. S/As $24_1$, $24_2$, $24_3$, and $24_N$ and LIAMPs $40_1$, $40_2$, $40_3$, and $40_N$ are shown. The others are represented by the ellipses located between S/As $24_3$ and $24_N$ and LIAMPs $40_3$ and $40_N$, respectively.

Main memory arrays $20_1$ to $20_N$ are connected to S/As $24_1$ to $24_N$. S/As 24 are used to amplify data emanating from main memory 20 without changing the state of the stored information. CAS_ is used to select one of the S/As 24 in each S/A bank $24_1$ to $24_N$ to be amplified by LIAMPs $40_1$ to $40_N$, respectively.

Each SAM 30 is connected to a SAM amplifiers (SAM AMP) $42_1$ that comprises SAM AMPs $42_1$ to $42_N$ and amplifies the signal emanating from SAM 30. SAM AMPs $42_1$, $42_2$, $42_3$, and $42_N$ are shown. The others are represented by the ellipses located between SAM AMPs $42_3$ and $42_N$.

LIAMPs 40 are connected via pull down lines 62 to common lines 60. Pull down lines 62 comprise individual pull down lines $62_1$ to $62_N$, such that each pull down line $62_1$ to $62_N$ is connected to its corresponding LIAMP $40_1$ to $40_N$ and to common line 60. Pull down lines $62_1$ to $62_N$ and common line $60_1$ to $60_N$ each have two lines (which are indicated by the numeral "2" placed on the lines). The two common lines 60 are used exclusively for design for test (DFT) operation. The common lines 60 carry a representation of the data held in each LIAMP 40 to the comparator 52 and are common to all amplifiers. Although not shown, other lines provide a way to read or write data to the LIAMPs 40 and SAM AMPs 42.

During the test of the present invention, the falling edge of RAS_ and the second and all subsequent falling edges of CAS_ precharge common lines 60. A reset operation at the beginning of the test cycle causes both common lines 60 to be precharged to a high voltage.

During the read operation for main memory 20, LIAMP 40 receives data from main memory 20 through S/A 24. The input state into LIAMP 40 causes each LIAMP 40 to cause one of common lines 60 to be pulled low. The other common line 60 is not affected by LIAMPs 40.

Common lines 60 are affected by LIAMPs $40_1$ to $40_N$ through pull down lines 62. Each pull down line $62_1$ to $62_N$ has an n-channel transistor (not shown) in each of the two lines that make up each pull down line $62_1$ to $62_N$. Pull down lines 62 respond to the state of input of LIAMPs 40 and respectively affect common lines 60.

Once common lines 60 are precharged high, due to their routing distance, they have a strong natural tendency to remain high due to their inherent capacitance. When an amplifier, for example a LIAMP 40 has data input, the pull down lines 62 respond by discharging an appropriate common line 60. The other common line 60 is unaffected by that particular amplifier.

If all of LIAMPs $40_1$ to $40_N$ have the same input data from main memory 20, they will all pull low the same common line 60. This will result in one common line 60 being high and one being low. If, however, one or more of the LIAMPs $40_1$ to $40_N$ have different data, the opposite common line 60 will be pulled low, and both common lines 60 will be low as a result.

Common lines 60 connect main memory 20 to a comparator 52, through S/A 24 and LIAMPs 40. Comparator 52 compares the data on common lines 60 with an expected data bit 50. Comparator 52 operates by evaluating the state of the common lines 60. If one line is high and the other is low, all LIAMPs $40_1$ to $40_N$ have the same input state. The logic level of common line 60 is compared against the expected data 50 state. The logic level of common line 60 is determined by checking which of the two lines is high. When the first common line 60 is high and the other is low, that corresponds to a voltage level representing a logic 1. When the second common line 60 is high and the first is low, that corresponds to a voltage level representing a logic 0. If the state of the common lines 60 and the expected data 50 state are the same, the expected data 50 state is output. If the state of common lines 60 and the expected data 50 are not the same, the opposite state of the expected data 50 state is output. Further, if both of the common lines 60 are low, or both are high, then the data input to LIAMPs 40 do not match and a failure has occurred regardless of the expected data 50 state. In that case, the opposite of the expected data 50 state is output as a result.

Additionally, common lines 60 indicate if data is supposed to be high or low. If the first common line 60 is high and the second is low, a high state was read. If the first common line 60 was low and the second high, a low state was read. Accordingly, if all test bits that were read were inversed during the test, comparator 52 could discern that the two common lines 60 were inversed and an error had occurred.

Expected data 50 is a predetermined data value based on the state of an originally written test data 48 and can be generated by a device tester or may have been generated previously and hard coded. Expected data 50 is equivalent to the original test data 48 wherein expected data 50 is identical to test data 48. The results of the comparison from comparator 52 are then output. This comprises the test system's on-chip comparison logic.

Alternatively, the output can be an indicator that flags when an defect has been detected and also a signal that indicates the quadrant of a defect. Laser repair decisions can be made based on this information. Also, the output could simply indicate if SAM 30 does not have any defects and passes, or has defects and fails.

An advantage of the present invention is that comparator 52 can be part of the same on-chip comparator logic used to test main memory 20. Accordingly, minimal amount of silicon area is necessary because nothing has to be added to the on-chip comparator logic.

Another advantage is that the test system utilizes the I/O pins from main memory 20. To test the semiconductor memory, test system 10 has a plurality of pins that can be connected to the device tester. The pins are connected to the device tester to test main memory 20. To perform this test, it is not necessary to connect additional serial data I/O pins of SAM 30 to the device tester.

A method to test SAM 30 can be seen by referring to steps 12, 14, 16, and 18 illustrated by arrows depicted in FIG. 1. Test data 48 is written to main memory 20. A row or partial row of main memory 20 is then copied from main memory 20 to SAM 30. Next, SAM 30 data is written from SAM 30 to a different known good row of main memory 20. Then the contents of main memory 20 are read and compared by comparator 52 with expected data 50. As a result of the test, the transfer to SAM 30, the SAM 30 storage cells, and the SAM 30 write to main memory 20 is tested in SAM arrays $30_1$ to $30_N$.

Considering each step more closely, at step 12, a main memory background write is done using test data 48. The bits of test data 48 are written to a known and good row in each of main memory arrays $20_1$ to $20_N$. The test data 48 could be generated from a device tester. The test data 48, however, should remain known.

Next, at step 14, the value stored in the main memory 20 row is transferred to SAM 30 creating a duplicate of the test data 48. This involves each of main memory arrays $20_1$ to $20_N$ transferring the bits of test data 48 from the external tester to SAM arrays $30_1$ to $30_N$. Alternatively, during step 12, test data 48 could be written directly to SAM 30, skipping step 14.

At step 16, the bits stored in SAM arrays $30_1$ to $30_N$ of SAM 30 are written back to main memory arrays $20_1$ to 20N in a different known good row than was used in step 12.

At step 18, the bits now stored in a known good row of main memory arrays $20_1$ to $20_N$ used in step 16 are sensed and amplified by the corresponding S/As $24_1$ to $24_N$ and to LIAMPs $40_1$ to $40_N$ when a column address is enabled. This operation provides a way to test the transfer, storage, and write operation on test data 48 with respect to SAM 30. From LIAMPs $40_1$ to $40_N$, the test bit 48 read from main memory 20 causes one of the two pull down lines $62_1$ to $62_N$ to discharge one of the two common lines 60. The common lines 60 are routed to all LIAMPs 40 and are affected by any LIAMPs 40 that are active.

Comparator 52 operates by evaluating the state of the common lines 60. If one line is high and the other is low, all LIAMPs $40_1$ to $40_N$ have the same input state. This is compared against the expected data 50 state. If the voltage level corresponding to the logic level of the state of the common lines 60 and the voltage level corresponding to the logic level of the state of expected data 50 are the same, a voltage level corresponding to the logic level of the state of expected data 50 is output. If the common lines 60 and the expected data 50 do not match, a voltage level corresponding to a logic level of the state opposite the expected data 50 is output. Further, if both common lines 60 are low, then the data input to LIAMPs $40_1$ to $40_N$ do not match. If both common lines 60 are high, then LIAMPs $40_1$ to $40_N$ failed to operate. In either condition, a failure has occurred regardless of the expected data 50 state. In that case, the opposite of the expected data 50 state is output as a result.

Output buffer 54 amplifies the state of comparator 52. During DFT operation, output buffer 54 responds to comparator 52 instead of the normal data output (not shown). Additionally, the device under test may have multiple output buffers 54, which may or may not be useful during the DFT operation.

Main memory 20 can be eliminated as a source of the defect by testing main memory 20. If a defect is discovered using the present invention, main memory 20 could be tested separately to determine if the failure occurred in main memory 20 or as a result of SAM 30 storage cell and/or transfer and write operations. When main memory 20 is tested individually and found to be free of defects, then the error should be in SAM 30. If main memory 20 is found to have a defect, at least main memory 20 is defective. If, however, a defect is not discovered, then both main memory 20 and SAM 30 are clear of defects. Accordingly, both SAM 30 and main memory 20 can be tested with minimal time and can be repaired to improve yield.

The method of the present invention is capable of detecting a "stuck at" fault. A "at" fault occurs when a bit will not change from logic 1 to logic 0 or logic 0 to logic 1; it remains stuck at either logic 0 or logic 1. A logic 0 corresponds to a low voltage level while a logic 1 corresponds to a high voltage level. A "stuck at" fault is tested by performing the present method at least twice, with complimentary test data 48. Sending complimentary test data 48 involves once sending a logic 0 to be written to specific addresses of main memory 20 and SAM 30 and a second time sending a logic 1 to be written to the same specific addresses of main memory 20 and to SAM 30. If after writing a logic 0 and subsequently a logic 1, and a logic 1 is detected both times, then a bit is stuck at logic 1. If after writing a logic 1 and subsequently a logic 0, and a logic 0 is detected both times, then a bit is stuck at logic 0. Additionally, the exact memory location can be discerned by knowing the bit that was stuck.

Figure 2:
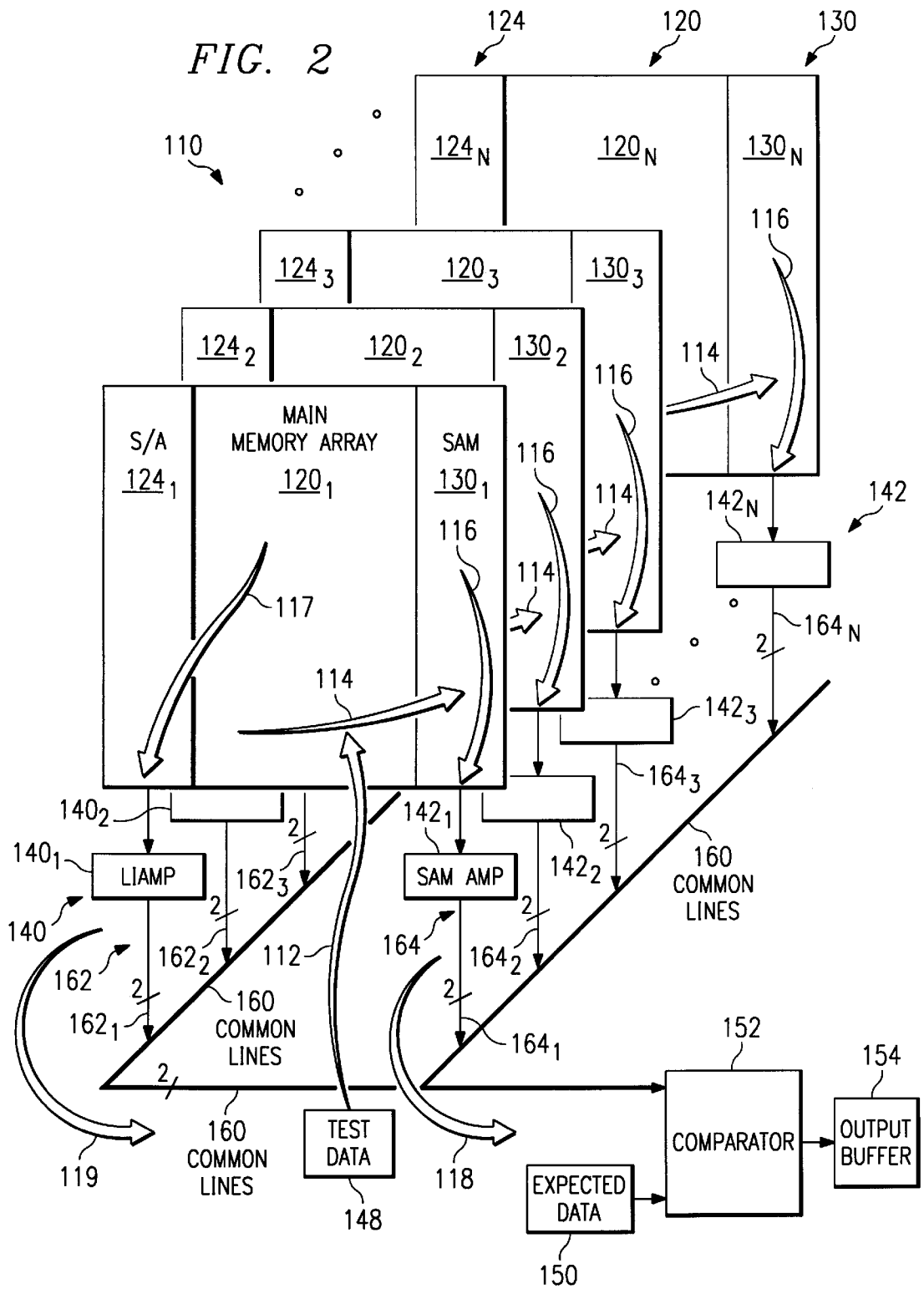
FIG. 2 illustrates a block diagram of a test system of a semiconductor serial access memory according to a second embodiment of the present invention.

According to FIG. 2, a block diagram of a test system of a semiconductor serial access memory according to a second embodiment of the present invention is depicted. A test system 110 includes a semiconductor memory, for example a VRAM. The semiconductor memory of test system 110 includes a main memory 120 comprising main memory arrays $120_1$ to $120_N$ connected to a SAM 130 comprising SAM arrays $130_1$ to $130_N$ and to S/A 124 comprising S/As $124_1$ to $124_N$. Test system 110 also includes multiple LIAMPs 140 comprising LIAMPs $140_1$ to 140, connected to each S/As $124_1$ to $124_N$. Additionally, multiple SAM AMPs 142 comprising SAM AMPs $142_1$ to $142_N$ are connected to SAM 130. All of these components are similar to the same elements of test system 10.

Main memory 120 includes a plurality of I/O pins (not shown). This plurality of I/O pins are used to connect the semiconductor memory to a device tester (not shown). The same plurality of I/O pins, connected to the device tester to test main memory 120 using conventional methods, are used to test SAM 130. Additionally, while SAM 130 can also have a plurality of I/O pins (not shown), the data I/O pins of SAM 130 need not be connected to the device tester.

Pull down lines 162 have two lines by which to discharge the common lines 160 and connect main memory 120 to common lines 160 through S/A 24 and LIAMP 140. Pull down lines 164 also have two lines by which to discharge common lines 160 and connect SAM 130 to common lines 160 through SAM AMPs 142. Pull down lines 162 and 164 comprise pull down lines $162_1$ to $162_N$ and $164_1$ to $164_N$, respectively. Pull down lines 162 and 164 and common lines 160 each have two data lines (which are indicated by the numeral "2" placed on the lines). The two lines allow the state of test data 148 from main memory 120 and SAM 130 to equally effect the state of common lines 160. Alternatively, common lines 160 could be a bus.

Although not shown, other I/O lines are connected to main memory 120 and other devices and also to SAM 130 and other devices. In this embodiment, the rising edge of the serial clock can precharge common lines 160.

Once common lines 160 are precharged high, due to their routing distance, they have a strong natural tendency to remain high due to their inherent capacitance. When an amplifier, for example a LIAMP 140 or a SAM AMP 142, has data input, the pull down lines 162 and/or 164 respond by discharging an appropriate common line 160. The other common line 160 is unaffected by that particular amplifier.

Because multiple amplifiers can affect common lines 160, common lines 160 represent multiple amplifier inputs. If just one of the common lines 160 is low, then all amplifiers affecting common lines 160 had the same data. If both lines 160 are low, one or more amplifiers had data opposite the other amplifiers.

The two common lines 160 are used exclusively for DFT operation, and can carry a representation of the data held in each of LIAMPs 140 and SAM AMPs 142, depending on which amplifiers are active. Comparator 152 then operates in a similar fashion as comparator 52 to evaluate the state of common lines 160. Additionally, output buffer 154 uses comparator 152 as an input instead of the normal read data pathway (not shown) while in DFT mode. Further, common lines 160 could be a plurality of lines, even N separate lines if it was desired.

The on-chip comparison logic is expanded to include pull down lines 162 and 164 from main memory 120 and SAM 130, respectively. To facilitate this, SAM AMPs 142 are connected to common lines 160 via pull down lines 164. Accordingly, test data 148 from SAM 130 can have a direct effect on the state of common lines 160. Comparator 152 can compare common lines 160 with expected data 150 and output the result.

This embodiment also is advantageous because comparator 152 can be part of the same on-chip comparator logic used to test main memory 120. Accordingly, minimal amount of silicon area is needed because just the SAM AMP 142 pull down n-transistors are added to the on-chip comparator logic. Additionally, test system 110 utilizes the I/O pins from main memory 120 so the data I/O pins of SAM 130 do not have to be connected to the device tester.

Depending on the DFT mode selected, LIAMPs 140 and/or SAM AMPs 142 can affect the state of common lines 160. This is advantageous because the same organization is used for all comparison tests, however, some amplifiers may not be active to limit the array of memory tested. This includes separating LIAMPs 140 from SAM AMPs 142 in test.

A method to test SAM 130 can be seen by referring to steps 112, 114, 116, and 118 illustrated by arrows depicted in FIG. 2. This method first writes test data 148 to main memory 120. Test data 148 is then transferred from main memory 120 to SAM 130. Then the contents of SAM 130 are used to affect common lines 160, which are compared by comparator 152 with expected data 150. During this test, SAM arrays $130_1$ to $130_N$ are tested concurrently.

Considering each step more closely, at step 112, a main memory background write is done using test data 148. The multiple bits of test data 148 are written to each of main memory arrays $120_1$ to $120_N$ along a row. Test data 148 is generated from a device tester. Test data 148 may have been generated previously and hard coded. The test data 148, however, should remain known. Test data 148 is sent over input leads to the respective main memory arrays $120_1$ to $120_N$ of main memory 120. Each of main memory arrays $120_1$ to $120_N$ store the data in an addressed storage cell that corresponds to the appropriate bit it is supposed to store.

Next, at step 114, the data stored in main memory 120 is transferred to SAM 130. This involves each of main memory arrays $120_1$ to $120_N$ transferring the bits stored along a row to SAM arrays $130_1$ to $130_N$.

At step 116, the bits stored in SAM arrays $130_1$ to $130_N$ of SAM 130 are clocked out of SAM 130 by the serial clock to the corresponding SAM AMPs $142_1$ to $142_N$. This involves one bit of data being read from each of SAM arrays $130_1$ to $130_N$ responding to a read operation. Data is sent from SAM 130 to SAM AMPs 142 by the rising edge of the serial clock.

At step 118, the bits in SAM AMPs 142 affect common lines 160 as previously described. Common lines 160 enter into comparator 152. Common line 160 can be compared to the known value of the original test data 148 through expected data 150. Comparator 152 either maintains expected data 150 or inverts expected data 150 based on the state of common lines 160 and expected data 150 as previously described. If the output of the DFT test is opposite the state of expected data 150, which could be provided by the device tester, then a defect exists in either the SAM 130 or main memory 120. Output can be an indicator that flags when an defect has been detected and also a signal that indicates the quadrant of a defect. Laser repair decisions can be made based on this information. Alternately, the output could simply indicate if SAM 130 does not have any defects and passes, or has defects and fails.

Main memory 120 can be eliminated as a source of the defect by testing main memory 120, as described above. Additionally, this method of the present invention is also capable of detecting a "stuck at" fault as described above.

Generally, the expected data 150 bit and the comparison output are operated just when the device is in a DFT test cycle. This method has expected data 150 latched on the rising edge of the serial clock. The control signal that allows main memory 120 I/O pins to turn on can be activated using an output enabled (OE__) signal (not shown). The OE__ signal is usually gated by the RAS__ clock falling and by the RAS__ clock and/or the CAS__ clock rising. Alternatively, the OE__ activation to turn on output buffer 154 can be controlled by the DFT mode activation.

Alternatively, another method for testing the serial access memory can be employed using the method described above. The actions of steps 112, 114, 116, and 118 are similar to those depicted above. However, in this method, expected data 150 is latched on main memory 120 controls instead of the serial clock.

In a standard main memory test, the expected data bit 150 is latched on the fall of the RAS__ clock and on the second and subsequent falling edge of the CAS__ clock in a page mode operation. In this alternative test, a serial cycle can be a part of main memory 120 cycle so that the serial data can be compared against expected data 150 bit. During this test, the OE__ is activated normally by the dynamic random access memory (not shown) cycle. The serial cycle fetches the next serial address and also resets the comparison logic, i.e., precharging the common lines 160 to a high voltage level. Because main memory 120 cycles occur with this approach, main memory 120 outputs are active. However, the other contents of main memory 120, not needed for this test, will not be compared against the expected data 150 bit. The same main memory 120 output buffer 154 used for the test is connected to the external tester. The other outputs of main memory 20 (not shown), even though they are active, do not have to be connected to the external tester because the comparison operation is performed on-chip. This is advantageous because the noise induced by having all normal outputs active provides an operational environment similar to normal operation.

Accordingly, this method can be done with minimal changes to the internal on-chip comparison logic, except for the serial cycle reset of the comparison logic and the additional internal pull down circuits in SAM AMPs 142 needed for the serial data.

Another method of testing SAM 130 can be seen by referring to steps 112, 114, 116, 117, 118, and 119 illustrated by arrows depicted in FIG. 2. This method uses steps 112, 114, 116, and 118, as described above, but also uses steps 117 and 119.

Step 117 occurs at the same time as step 116. As described above, step 116 clocks the bits stored in SAM arrays $130_1$ to $130_N$, responsive to the serial clock, and sends them to the corresponding SAM AMPs $142_1$ to $142_N$. In step 117, the bits stored in main memory arrays $120_1$ to $120_N$ of main memory 120 are sent to the corresponding S/As $124_1$ to $124_N$ and to LIAMPs $140_1$ to $140_N$, responsive to a column select operation. This involves transferring the bit selected by the column operation from S/As $124_1$ to $124_N$ to LIAMPs $140_1$ to $140_N$.

Steps 118 and 119 occur at the same time. This is made possible by synchronizing the column access and the serial access of SAM 130, through the CAS_ and serial clock controlled signals. In step 119, the LIAMPs 140, which have received the bits selected from S/A 124 in step 117, respond to the data. LIAMPs 140's pull down lines 162 are responsive to LIAMPs 140's input and cause one of the two common lines 160 to be discharged. Each active LIAMP $140_1$ to $140_N$ operates independently. In step 118, SAM AMPs 142, which have received the bits selected from SAM 130 in step 116, respond to the data. SAM AMPs 142's pull down lines 164 are responsive to SAM AMPs 142's input and causes one of the two common lines 160 to be discharged. Note these are the same common lines that LIAMPs 140's pull down lines 162 affect. Each of active SAM AMPs 142 operate independently. The resulting state of common lines 160 is that one line is low and one line is high, or both are low. These results are interpreted by comparator 152 in conjunction with expected data bit 150, as previously described.

The external clocks, CAS_ and serial clock, that control main memory 120 and SAM 130, respectively, can be synchronized, wherein data being read from main memory 120 and SAM 130 from LIAMPs 140 and SAM AMPs 142, respectively, would be available for comparison at the same time. This test is similar to the test of the first embodiment, except that the test data 148 from main memory 120 is compared to SAM 130 through the use of common lines 160.

In comparator 152, the state of common lines 160 and expected data bit 150 are evaluated, as previously stated. If one of the common lines 160 is high and the other is low, all of LIAMPs 140 and SAM AMPs 142 have the same input data. This is compared against expected data bit 150. If common lines 160 state matches expected data bit 150, comparator 152 will output the state of expected data bit 150. If they do not match, the inverse of expected data 150 will be output from comparator 152. Further, if both common lines 160 are low, one or more of the amplifiers have opposite data and a failure has occurred. Comparator 152 will output the inverse of expected data 150. The amplifiers can be selected to be activate in particular memory arrays to provide quadrant information. Quadrant information indicates that a certain quadrant of memory is defective. Output 154 amplifies the output results of comparator 152. Output 154 is responsive to comparator 152 instead of the normal data output while the DFT operation is active. Also, the output can be an indicator that flags when an defect has been detected.

Alternatively, output could be a signal that indicates the precise address of a defect. Also, the output could simply be an indicator that indicates a pass state if defects have not been detected and a fail state if at least one defect has been detected. This method of the present invention is also capable of detecting a "stuck at" fault as described above, by applying complimentary data to the memory area under test using two complete test cycles.

Again, this test is accomplished in minimal time and does not have to use the serial data I/O pins, because main memory 120 test is still intact except that the internal main memory 120 data is also being compared against SAM 130 data along with the expected data 150 bit.

Figure 3:
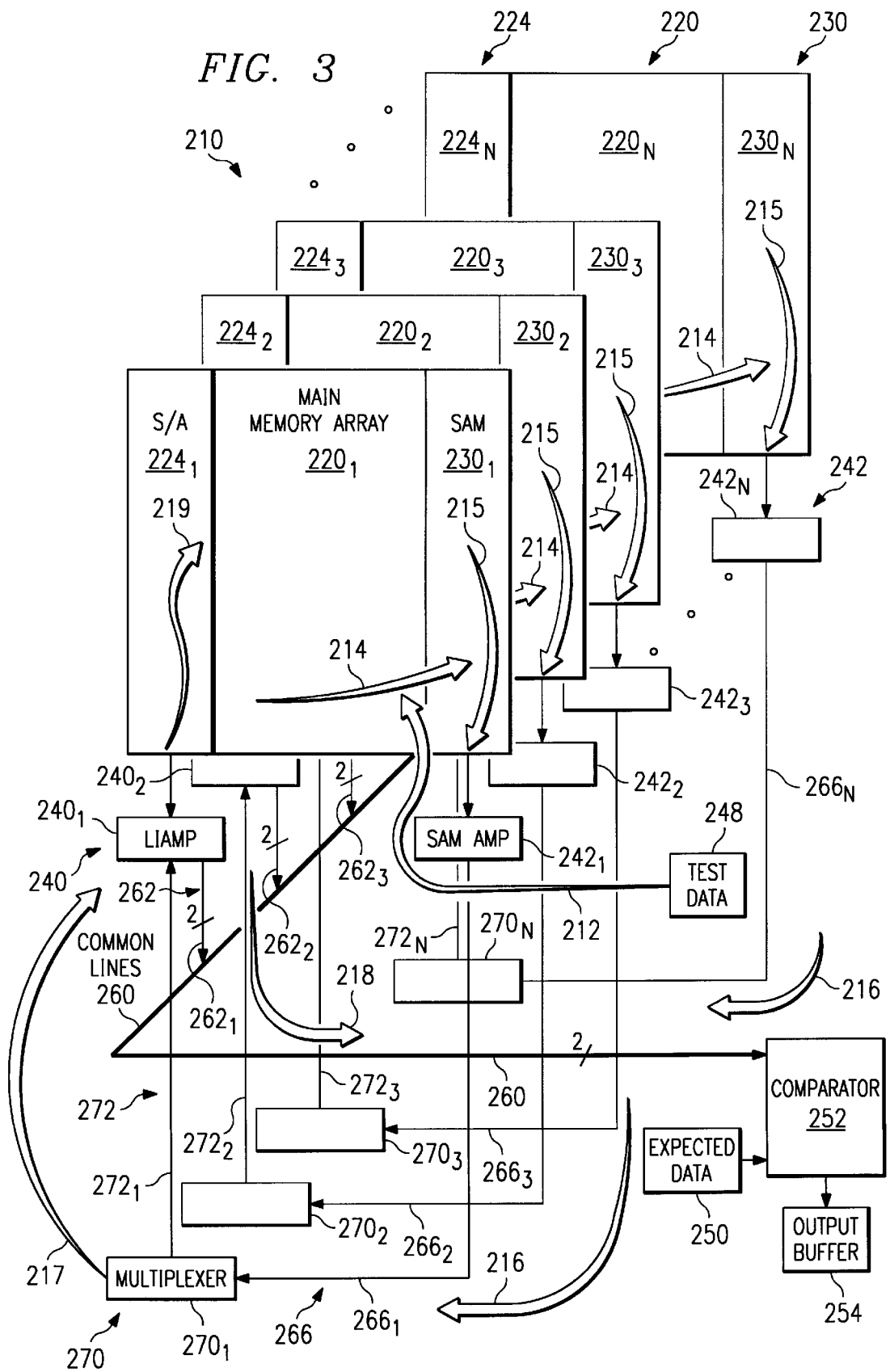
FIG. 3 illustrates a block diagram of a test system of a semiconductor serial access memory according to a third embodiment of the present invention.

According to FIG. 3, a block diagram of a test system of a semiconductor serial access memory according to a third embodiment of the present invention is depicted. A test system 210 includes a semiconductor memory, for example a VRAM. The semiconductor memory of test system 210 includes a main memory 220 comprising main memory arrays $220_1$ to $220_N$ connected to a SAM 230 comprising SAM arrays $230_1$ to $230_N$ and to a S/A 224 comprising S/As $224_1$ to $224_N$. Test system 210 also includes a LIAMP 240 comprising LIAMPs $240_1$ to $240_N$ connected to each corresponding S/As $224_1$ to $224_N$. Additionally, a SAM AMP 242 comprising SAM AMPs $242_1$ to $242_N$ is connected to SAM 230. All of these components are similar to the same elements of test system 10.

Main memory 220 includes a plurality of I/O pins (not shown). This plurality of I/O pins is used to connect the semiconductor memory to a device tester (not shown). The same plurality of I/O pins, connected to the device tester to test main memory 220 using conventional methods, is used to test SAM 230. Additionally, while SAM 230 can also have a plurality of data I/O pins (not shown), the data I/O pins of SAM 230 need not be connected to the device tester.

Pull down lines 262 connect LIAMPs 240 to common lines 260. Alternatively, common lines 260 could be a bus. Pull down lines 262 and common lines 260 each have two lines (which are indicated by the numeral "2" placed on the lines). Although not shown, other I/O lines are connected between main memory 220 and other devices and also between SAM 230 and other devices.

Pull down lines 262 comprise pull down lines $262_1$ to $262_N$ and connect main memory 220 to common line 260 through S/A 224 and LIAMPs 240. Accordingly, test data 248 coming from main memory 220 through S/A 224 and entering LIAMP 240 allows LIAMP 240 to respond to the test data 248 and affect common lines 260. Common lines 260 connect to all LIAMPs 240 and to comparator 252. Comparator 252 can compare the state of the common lines 260 with expected data 250 and output the result through output buffer 254. Further, common lines 260 could be a plurality of lines, even N separate lines if it was desired.

The SAM AMPs 242 are connected to lines 266, comprising individual lines $266_1$ to $266_N$. Lines 266 are single ended lines but could equally function as differential lines. Lines 266 connect SAM 230 to write multiplexer 270 through SAM AMPs 242. Write multiplexer 270 includes individual multiplexers $270_1$ to $270_N$. Write multiplexer 270 writes the data that comes from line 266, from SAM AMPs 242 and SAM 230, to lines 272, comprising lines $272_1$ to $272_N$. The data travels through lines 272 to LIAMPs 240. The write multiplexers 270 are used to receive the data from data lines 266 instead of the normal write data which would originate from the external tester or in a normal system environment. Write multiplexers 270 select one of these two inputs, i.e., line 266 or normal write data, as a result of control signals such as the entry into the DFT mode to select the lines 266.

LIAMPs 240 can receive the data from the write multiplexers 270 and respond immediately on common lines 260 or can be used to write the data into main memory 220 to be examined at a later time. In the latter case, LIAMPs 240 can still be responsive to the data from the write multiplexers 270 with regards to common lines 260, but common lines 260 do not have to be compared with expected data 250 at that specific time.

From pull down lines 262 common lines 260 respond and flow into comparator 252. Output is generated from comparator 252. Optionally, the data can be written to main memory 220 from LIAMPs 240.

This embodiment also is advantageous because comparator 252 can be part of the same on-chip comparator logic used to test main memory 220. Accordingly, minimal amount of silicon area is needed because nothing has to be added to the on-chip comparator logic. Additionally, the test system utilizes the I/O pins from main memory 220 and the data I/O pins of the SAM 230 do not have to be connected to the device tester.

A method to test SAM 230 can be seen by referring to steps 212, 214, 215, 216, 217, 218, and 219 illustrated by arrows depicted in FIG. 3. Test data 248 is written to main memory 220. Test data 248 is then transferred from a row in main memory 220 to SAM 230. Then, an address in SAM 230 is read and as a result of a serial clock rising edge, is sent to multiplexer 270. Multiplexers 270 then sends the data to LIAMPs 240. LIAMPs 240 can be used to write the data to main memory 220 for evaluation in the future and/or LIAMPs can respond to the data by pulling down on one of the common lines 260 through pull down lines 262. Common lines 260 connect to comparator 252 to be compared to expected data 250. During this test, SAM arrays $230_1$ to $230_N$ are tested concurrently.

Considering each step more closely, at step 212, a main memory background write is done using test data 248. The test data 248 is written to each of main memory arrays $220_1$ to $220_N$. Test data 248 can be any predetermined data value and can be generated by a device tester or may have been generated previously and hard coded. The test data 248, however, should remain known. Each of main memory arrays $220_1$ to $220_N$ store the data signal in an addressed storage cell that corresponds to the appropriate bit it is supposed to store.

Next, at step 214, a row stored in main memory 220 is transferred to SAM 230. This involves each of main memory arrays $220_1$ to $220_N$ transferring the corresponding row to SAM arrays $230_1$ to $230_N$.

At step 215, a bit stored in SAM arrays $230_1$ to $230_N$ of SAM 230 are sent to the corresponding SAM AMPs $242_1$ to $242_N$ in response to the rising edge of the serial clock. This involves each of SAM arrays $230_1$ to $230_N$ sending a stored bit to SAM AMPs $242_1$ to $242_N$. One bit from each SAM arrays $230_1$ to $230_N$ is sent on each rising edge of the serial clock.

At step 216, the bits in SAM AMPs 242 are sent to corresponding lines 266, comprising lines $266_1$ to $266_N$. The bits are then sent to write multiplexer 270. Lines 266 are shown as single ended lines, but could be differential lines.

At step 217, write multiplexer 270 sends the data along lines 272. From lines 272 the data enters LIAMPs 240.

At step 218, LIAMPs 240 are responsive to the input of data from lines 272. As a result, the pull down lines 262 of each LIAMP 240 will discharge one of the common lines 260 and not affect the other line 260. Common lines 260 connect to comparator 252. The state of common lines 260 can be compared to the known value of the expected data 250, as described with the other embodiments. Common lines 260 substantially match the expected data 250 when all of the bits from main memory arrays $220_1$ to $220_N$ substantially match the corresponding bit from expected data bit 250. Otherwise, comparator 252 outputs an inversion of the expected data when one or more the bits from main memory arrays $220_1$ to $220_N$ do not substantially match the corresponding bit from expected data 250. If common data lines 260 do not substantially match the original expected data 250, then a defect exists in either SAM 230, the background write to main memory 220 during step 212, or in one of the rows of main memory 220 during step 219, if multiple rows of main memory 220 were used to store data from SAM 230 during multiple tests. These other possible defects, however, can be eliminated using other tests thereby determining if SAM 230 is defective. Alternatively, the output can be merely an indicator that flags when a defect has been detected or can be a pass state if defects have not been detected.

Main memory 220 can be eliminated as a source of the defect by testing main memory 220, as described above. Additionally, this method of the present invention is also capable of detecting a "stuck at" fault as described above.

Again, this test can be accomplished in minimal time and can be performed without using the data I/O pins of SAM 230. Essentially, this method can be performed by adding write multiplexer 270 and lines 266 to move the data from the SAM pipeline to the write multiplexer 270.

Further, a main memory test could be easily facilitated with this test. At step 219, data could be copied and written from LIAMPs 240 back to main memory 220. This data could be stored in main memory 220 for future testing using standard testing for main memory 220.

Step 219 would be useful to run multiple tests on SAM 230. A first test could be run on SAM 230, with the test data 248 being ultimately sent to LIAMP 240. During step 219, LIAMP 240 could send the test data 248 to one address of main memory 220 instead of to comparator 252. A second test could be run on SAM 230, this time during step 219, the test data could be sent from LIAMP 240 to a second address on main memory 220. This could be repeated until all tests on SAM 230 were completed. Once multiple tests were run on SAM 230, the multiple addresses of main memory 220 could then be tested, determining if SAM 230 had sent the correct test data 248 and was therefore free of defects. This would allow all the tests to be performed on SAM 230 and at some later time check the output.

Optionally, a main memory 220 test can be performed immediately after the serial data was written to main memory 220 and could rely on the data in LIAMP 240. As long as the write operation to main memory 220 is not cancelled, LIAMP 240 will retain the state of the data from the write multiplexers 270. While the data is in LIAMP 240, it is irrelevant what data is in main memory 220. Therefore, a main memory 220 test could be run immediately after the SAM 230 test using the data from LIAMP 240. This would allow a main memory 220 test to be performed quickly after the serial access memory 230 test.

While this invention has been described with reference to illustrative embodiments, it is to be understood that this description is not intended to be construed in a limiting sense. Various modifications and combinations of the illustrative embodiments will be apparent to persons skilled in the art upon reference to this description. It is to be further understood, therefore, that numerous changes in the details of the embodiments of the present invention and additional embodiments of the present invention will be apparent to, and may be made by, persons of ordinary skill in the art having reference to this description. It is contemplated that all such changes and additional embodiments are within the spirit and true scope of the invention as claimed before.

What is claimed is:

1. A method for testing a serial access memory through a main memory, said method comprising:

providing a semiconductor memory, said semiconductor memory comprising said main memory and said serial access memory;

generating a test data, wherein an expected test data is equivalent to said test data;

storing said test data in said serial access memory;

sending said test data from said serial access memory to said main memory;

storing said test data in said main memory;

reading said test data from said main memory;

comparing said test data read from said main memory with said expected test data using at least two common lines, wherein said at least two common lines indicate if said serial access memory has at least one defect; and producing an output having a first state if said test data read from said main memory is similar to said expected test data or a second state if said test data read from said main memory is different than said expected test data.

2. A method for testing a serial access memory through a main memory, said method comprising:

providing a semiconductor memory comprising said serial access memory and said main memory;

generating a test data, wherein an expected test data is equivalent to said test data;

storing said test data in said main memory;

sending said test data from said main memory to said serial access memory;

storing said test data in said serial access memory;

reading said test data from said serial access memory;

reading said test data from said main memory;

comparing said test data read from said serial access memory with said test data read from said main memory and said expected data;

producing an output having a first state if said test data read from said serial access memory is similar to said test data read from said main memory and is similar to said expected data or a second state if said test data read from said serial access memory is different than said test data read from said main memory or is different than said expected date; and wherein said comparing step indicates if said serial access memory has at least one defect.

3. A test system for testing a serial access memory through a main memory comprising:

a semiconductor memory comprising a main memory and said serial access memory, wherein said serial access memory has a plurality of data input/output pins, wherein none of said plurality of data input/output pins of said serial access memory are connected to a device tester;

a test data, wherein said test data can be transferred to and stored in said main memory, then said test data from said main memory can be transferred to and stored in said serial access memory, and then said test data from said serial access memory can be transferred to and stored in said main memory;

an expected test data, wherein said expected test data is equivalent to said test data; and a comparator, wherein said comparator is connected to said main memory and is used to compare said test data from said main memory with said expected test data, wherein said comparator outputs a first state if said test data from said main memory is similar to said expected test data or a second state if said test data from said main memory is different than said expected test data.

4. The test system of claim 3, wherein said semiconductor memory is a video random access memory.

5. The test system of claim 3 further comprising at least two common lines, wherein said at least two common lines indicate if said serial access memory has at least one defect.

6. The test system of claim 3, wherein said serial access memory is in communication with said serial access memory and can write data to said main memory.

7. The test system of claim 3, wherein said main memory comprises at least a first and a second location, whereby said test data can be transferred to and stored in said first location of said main memory, then said test data from said first location of said main memory can be transferred to and stored in said serial access memory, and then said test data from said serial access memory can be transferred to and stored in said second location of said main memory.

8. The test system of claim 3, wherein said first state of said comparing step is at a voltage level corresponding to a same logic level as said expected test data.

9. The test system of claim 3, wherein said serial access memory is a register.

* * * * *